United States Patent
Fanduzzi et al.

(10) Patent No.: US 11,863,083 B2
(45) Date of Patent: Jan. 2, 2024

(54) RECTIFIER ASSEMBLY

(71) Applicant: Eaton Intelligent Power Limited, Dublin (IE)

(72) Inventors: Peter J. Fanduzzi, Kenosha, WI (US); Paul J. Siebenlist, Iron Ridge, WI (US); Mayur Kothari, Pune (IN); Michael K. Balck, Wauwatosa, WI (US); Sudershan Gawali, Pune (IN); Derek Baxter, Milwaukee, WI (US); Craig H. DePas, Port Washington, WI (US)

(73) Assignee: Eaton Intelligent Power Limited, Dublin (IE)

( * ) Notice: Subject to any disclaimer, the term of this patent is extended or adjusted under 35 U.S.C. 154(b) by 444 days.

(21) Appl. No.: 17/201,609

(22) Filed: Mar. 15, 2021

(65) Prior Publication Data

US 2021/0328522 A1   Oct. 21, 2021

Related U.S. Application Data

(60) Provisional application No. 63/011,015, filed on Apr. 16, 2020.

(51) Int. Cl.
| | | |
|---|---|---|
| *H02M 7/00* | (2006.01) | |
| *H02M 7/06* | (2006.01) | |
| *H05K 7/20* | (2006.01) | |
| *H02P 27/06* | (2006.01) | |

(52) U.S. Cl.
CPC ............ *H02M 7/003* (2013.01); *H02M 7/06* (2013.01); *H05K 7/209* (2013.01); *H05K 7/20909* (2013.01); *H02P 27/06* (2013.01)

(58) Field of Classification Search
CPC . H05K 7/209; H05K 7/20909; H05K 7/20918
See application file for complete search history.

(56) References Cited

U.S. PATENT DOCUMENTS

| | | |
|---|---|---|
| 5,455,759 A | 10/1995 | Paice |
| 6,525,951 B1 | 2/2003 | Paice |
| 8,488,354 B2 | 7/2013 | Swamy |

(Continued)

OTHER PUBLICATIONS

3-Phase Power Supply, 12 & 18 Pulse Solutions, Bonitron M3713 Series Information Sheet, Bonitron, Inc., available at https://www.bonitron.com/PDFs/Brochures/M3713_12&18Pulse_111019_20140416.pdf, downloaded May 28, 2020.

(Continued)

*Primary Examiner* — Adolf D Berhane
*Assistant Examiner* — Afework S Demisse
(74) *Attorney, Agent, or Firm* — DiBerardino McGovern IP Group LLC

(57) ABSTRACT

A rectifier assembly includes: a mounting base; and one or more rectification modules configured to be received in the mounting base, each rectification module including: an electronic network including one or more electronic elements configured to convert alternating current (AC) electrical power at an input of the rectification module to direct current (DC) electrical power at an output of the rectification module. Each of the one or more rectification modules is configured to be electrically connected to a DC bus of a driving apparatus that is separate from and independent of the rectifier assembly.

20 Claims, 13 Drawing Sheets

(56) References Cited

U.S. PATENT DOCUMENTS

2014/0313800 A1* 10/2014 Swamy .................. H02M 7/08
363/126
2015/0098257 A1* 4/2015 Wei ...................... H05K 7/1432
363/37

OTHER PUBLICATIONS

3-Phase Power Supply, Common Bus Solutions, Bonitron M3713 Series Information Sheet, Bonitron, Inc., available at https://www.bonitron.com/PDFs/Brochures/M3713_111019_20140416.pdf, downloaded May 28, 2020.

3-Phase Power Supply for 3-Phase Variable Frequency Drives, Model M3713SC Customer Reference Manual, Bonitron, Inc. (2018).

CPX9000 clean power drives in MCCs—the best solution for clean power, Motor control centers CPX9000 Data Sheet, Eaton Corp. (2011).

VLT® HVAC Drivers: A complete range of advanced solutions, Danfoss Product Brochure, Danfoss VLT Drives (2011).

PowerGard™ Series C 18-Pulse Enclosed Drive Controllers: Combining adjustable speed drive and power quality solutions, Schneider Product Brochure, Schneider Electric _ North American Operating Division (2006).

* cited by examiner

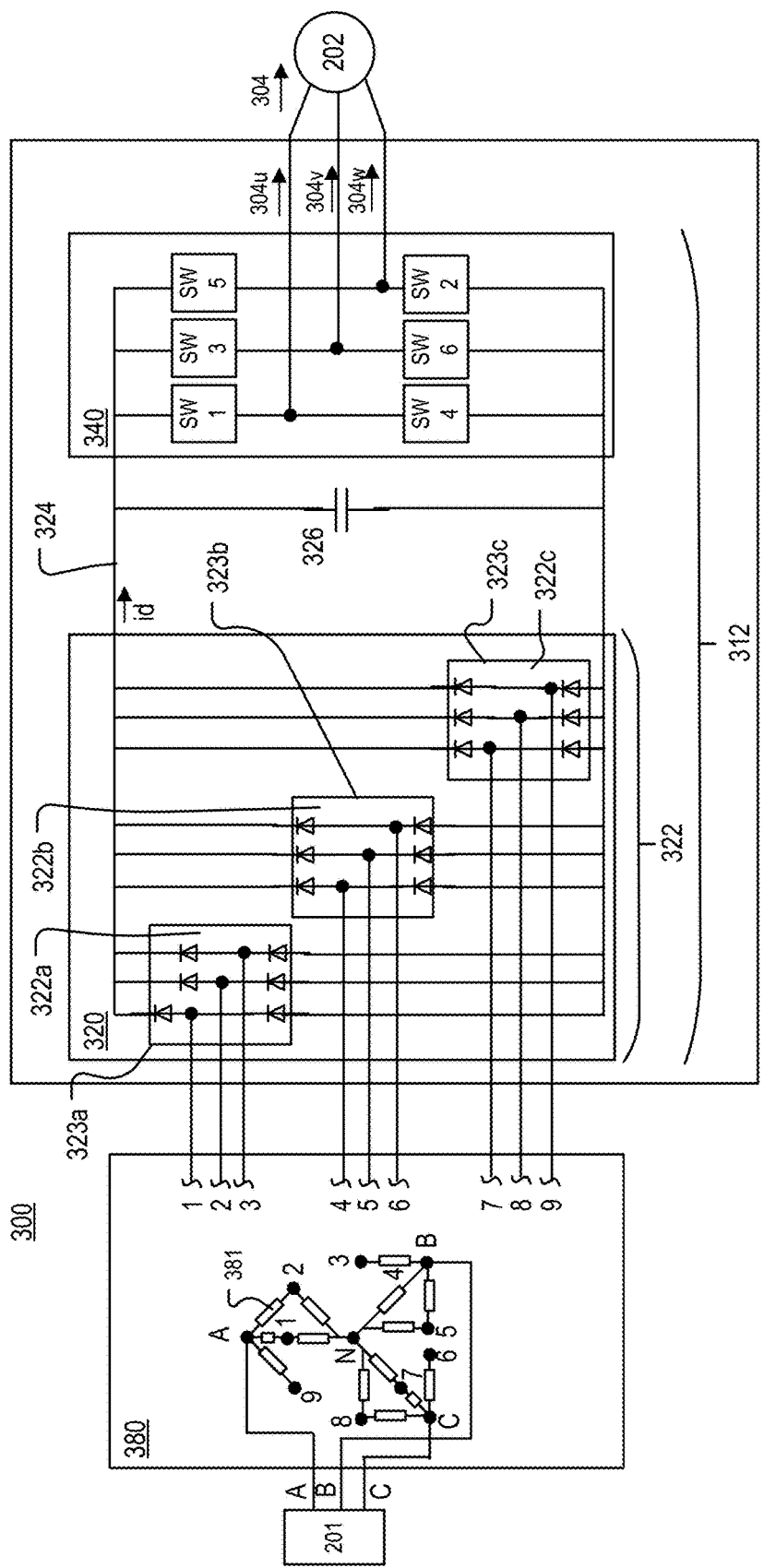

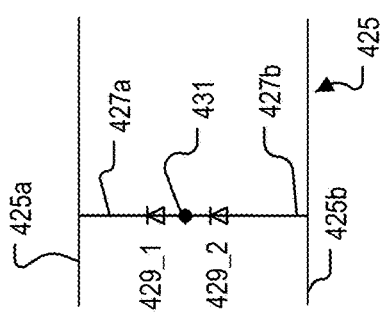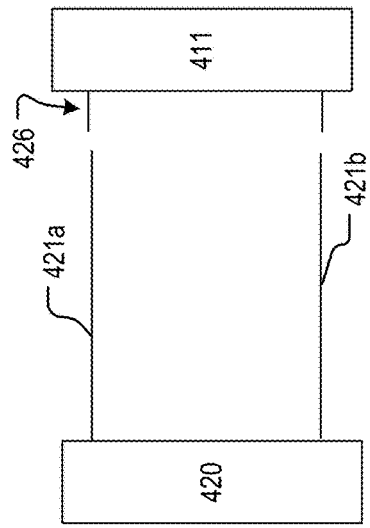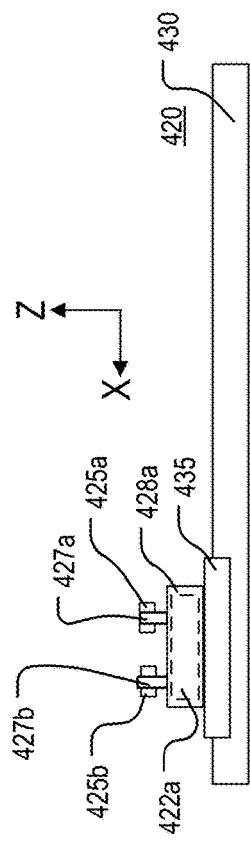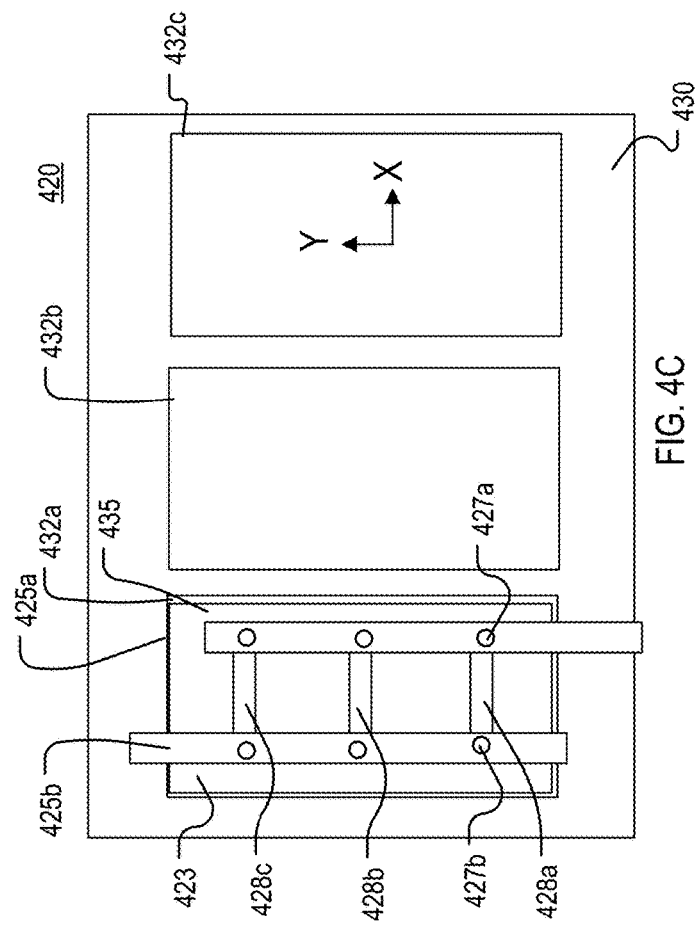

RECTIFIER ASSEMBLY

CROSS-REFERENCE TO RELATED APPLICATION

This application claims the benefit of U.S. Provisional Application No. 63/011,015, filed on Apr. 16, 2020 and titled RECTIFIER ASSEMBLY, which is incorporated herein by reference in its entirety.

TECHNICAL FIELD

This disclosure relates to a rectifier assembly. The rectifier assembly may be used with a variable speed drive (VSD), an adjustable speed drive (ASD), or any other type of alternating current (AC) drive.

BACKGROUND

An electrical apparatus, such as a variable speed drive, an adjustable speed drive, or an uninterruptable power supply, may be connected to an alternating current (AC) high-power electrical distribution system, such as a power grid. The electrical apparatus drives, powers, and/or controls a load, such as a motor, a machine, or a non-machine. The electrical apparatus includes an electrical network that converts AC power to direct-current (DC) power.

SUMMARY

In one aspect, a rectifier assembly includes: a mounting base; and one or more rectification modules configured to be received in the mounting base, each rectification module including: an electronic network including one or more electronic elements configured to convert alternating current (AC) electrical power at an input of the rectification module to direct current (DC) electrical power at an output of the rectification module. Each of the one or more rectification modules is configured to be electrically connected to a DC bus of a driving apparatus that is separate from and independent of the rectifier assembly.

Implementations may include one or more of the following features.

The rectifier assembly also may include a conductor electrically connected to each rectification module, where each conductor is configured to be electrically connected to the DC input of the separate and independent driving apparatus.

Each rectification module also may include at least one thermal exchange assembly. The thermal exchange assembly may include a heat sink. The heat sink may be thermally coupled to the rectification module.

In some implementations, the mounting base includes: a first sidewall; a second sidewall; a third sidewall substantially parallel to the second sidewall; and a fourth sidewall attached to the first sidewall, the second sidewall, and the third sidewall, and the first sidewall extends from the fourth sidewall at an angle that is less than 90 degrees. The rectifier assembly also may include one or more heat exchange assemblies, where each heat exchange assembly is associated with one rectification module. Each heat exchange assembly may include a passive cooling element and an active cooling element, where the active cooling element is configured to increase an amount of heat removed from the rectification module by the passive cooling element. Each passive cooling element may be a heat sink and each rectification module is thermally coupled to one of the heat sinks, and each active cooling element may be a fan. The rectifier assembly also may include a baffle configured to direct air drawn by the fan toward the heat sinks. In some implementations, the rectifier assembly includes three rectification modules, each of the three rectification modules includes six diodes, and the total of eighteen diodes forms an 18-pulse rectifier.

In another aspect, a rectifier assembly for use with an alternating current (AC) drive includes: a mounting base; a plurality of rectification modules configured to be received in the mounting base, each rectification module including: an electronic network including a plurality of electronic elements configured to convert alternating current (AC) electrical power at an input of the electronic network to direct current (DC) electrical power at an output of the electronic network; a plurality of active heat exchange elements configured to be received in the mounting base, each of the active heat exchange elements associated with one of the rectification modules; and a DC bus including a first conductor, and a second conductor. The rectification modules are electrically connected across the DC bus.

Implementations may include one or more of the following features. Each of the active heat exchange elements may include a fan, and each rectification module also may include a heat sink thermally coupled to the electronic network, and the rectifier assembly also may include a baffle configured to direct air drawn by the fans toward the heat sinks.

In another aspect, a rectification module includes: a heat sink including: a substantially planar portion including a first side and a second side opposite the first side; and a plurality of fins that extend from the first side of the substantially planar portion; one or more housings attached to the second side of the substantially planar portion and thermally coupled to the substantially planar portion; an electronic network inside each of the one or more housings, where each of the electronic networks configured as a rectifier that converts AC power at an input of the rectifier to DC power at the output of the rectifier; and a DC bus including a first conductor, and a second conductor. Each of the first conductor and the second conductor are physically connected to the one or more housings and are electrically connected to output of the one or more rectifiers.

Implementations of any of the techniques described herein may include an apparatus, a device, a system, and/or a method. The details of one or more implementations are set forth in the accompanying drawings and the description below. Other features will be apparent from the description and drawings, and from the claims.

DRAWING DESCRIPTION

FIG. 3A shows another example of a system.

FIG. 3B shows an example of an electronic network.

FIGS. 4A and 4C show various aspects of another example of a modular rectifier assembly.

FIG. 4B shows electrical connections of a diode module that may be used with the modulator rectifier assembly of FIGS. 4A and 4C.

FIG. 4D shows the modular rectifier of FIGS. 4A and 4C with a DC bus of an AC driving apparatus.

DETAILED DESCRIPTION

Figure 1:
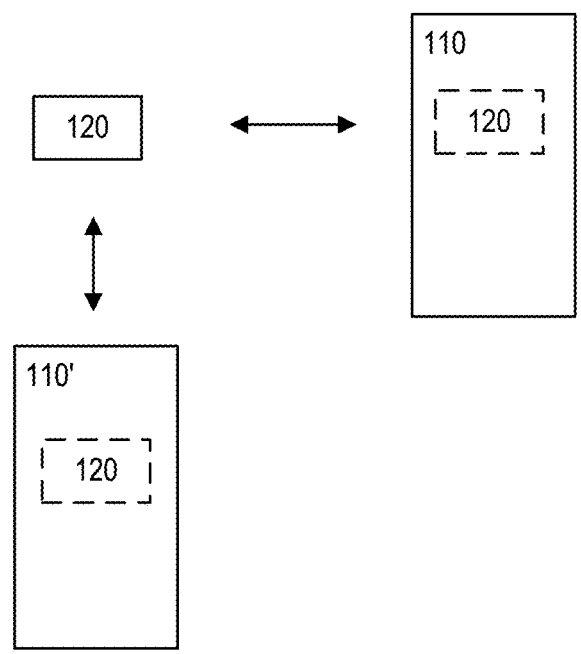
FIG. 1 shows an example of a modular rectifier assembly.

Referring to FIG. 1, a block diagram of an example of a modular rectifier assembly 120 is shown. The modular rectifier assembly 120 may be used with a driving apparatus 110 or a different driving apparatus 110'. Each of the driving apparatuses 110 and 110' is, for example, variable speed drive (VSD), an adjustable speed drive (ASD), or a variable frequency drive (VFD). The modular rectifier assembly 120 is separate from and independent of the driving apparatuses 110 and 110' and may be used with driving apparatuses other than the apparatus 110 and 110'. The modular rectifier assembly 120 may be used to upgrade, retrofit, and/or repair an existing driving apparatus or may be packaged and sold with a driving apparatus. The modular rectifier assembly 120 increases efficiency and performance while reducing costs by encouraging, enabling, and allowing reuse of existing equipment and by providing the operator or end user with the ability to select the installation location of the rectifier assembly 120.

Figure 2:
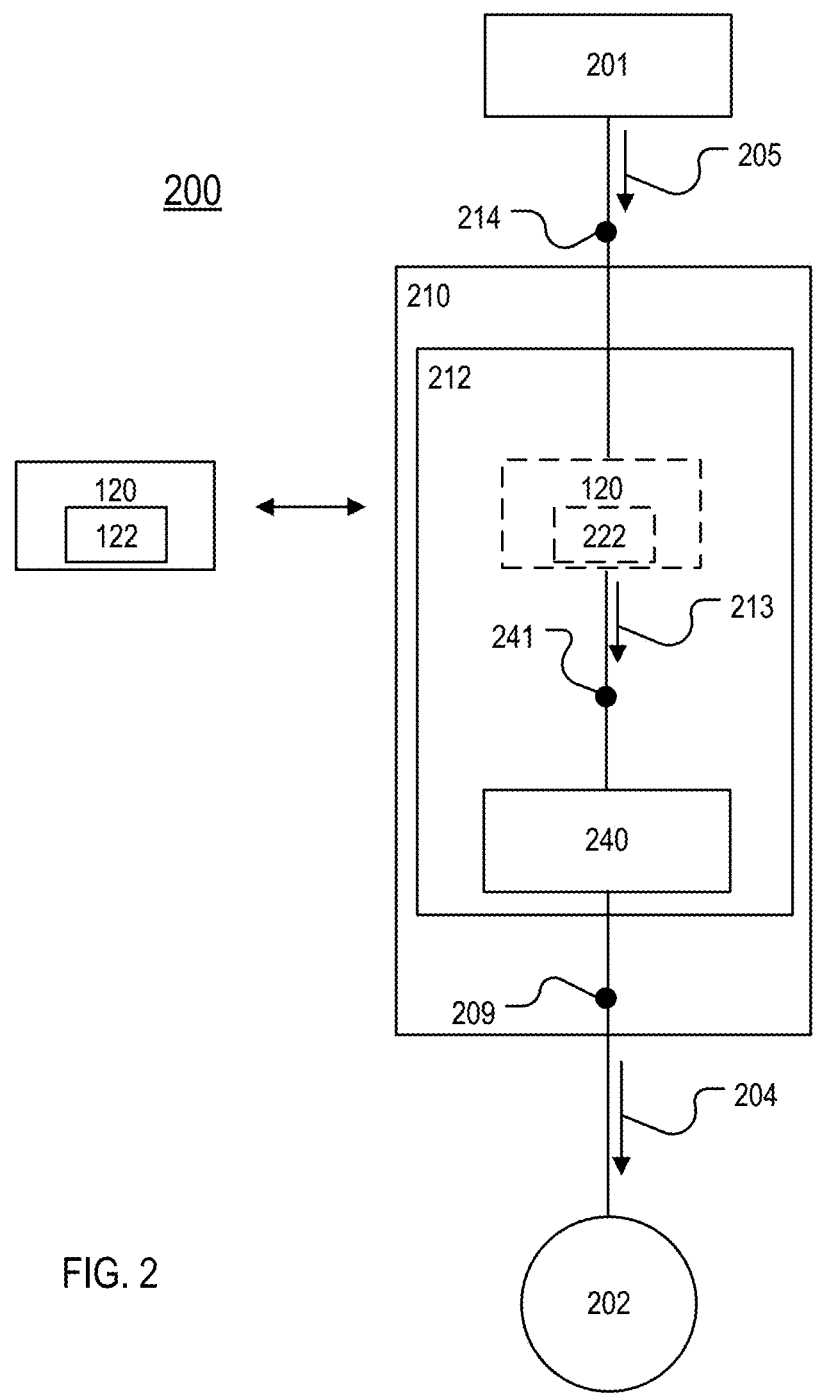
FIG. 2 shows an example of a system that uses the modulator rectifier assembly of FIG. 1.

FIG. 2 is a block diagram of a system 200 that includes a driving apparatus 210. The driving apparatus 210 is another example of a driving apparatus that may use the modular rectifier assembly 120. The driving apparatus 210 is electrically connected to an alternating current (AC) electrical power distribution network 201. The driving apparatus 210 generates an AC driving signal 204 based on AC electrical power 205 from the network 201, and the driving apparatus 210 provides the AC driving signal 204 to a load 202.

The electrical power distribution network 201 may be, for example, a multi-phase electrical power grid that provides electricity to industrial, commercial and/or residential customers. The AC electrical power distribution network 201 distributes AC electrical power that has a fundamental frequency of, for example, 50 or 60 Hertz (Hz). The distribution network 201 may have an operating three-phase line-to-line voltage of, for example, up to 690 volt (V) root mean square (RMS) for low voltage, and above 690V such as 10 kV for medium or high voltage. The network 201 may include, for example, one or more transmission lines, distribution lines, power distribution or substation transformers, electrical cables, and/or any other mechanism for transmitting electricity. The load 202 may be, for example, an induction machine, an induction motor, or a synchronous permanent magnet machine that operates at a speed and torque that is determined by the AC driving signal 204.

The driving apparatus 210 is any type of apparatus that is capable of producing the AC driving signal 204. The driving apparatus 210 may be, for example, a variable speed drive (VSD), an adjustable speed drive (ASD), or a variable frequency drive (VFD). The driving apparatus 210 and the load 202 are used in an industrial process. The industrial process may be, for example, a conveying process; a heating, ventilation, and air conditioning (HVAC) process; a natural gas or oil refining process; a mining process; a lighting process; or a pumping process.

The driving apparatus 210 includes an electrical system 212. The electrical system 212 receives AC electrical power 205 from the distribution network 201 at an input node 214 and provides an the AC driving signal 204 via an output node 209. When the rectifier assembly 120 is included in the driving apparatus 210, the electrical system 212 includes the rectifier assembly 120 and the inverter 240. The rectifier assembly 120 includes an electrical network 222 that converts the AC electrical power 205 into direct current (DC) electrical power 213. The electrical network 222 may be, for example, a plurality of diodes that are arranged to form a rectifier, for example, a 6-pulse, 12-pulse, or 18-pulse rectifier. The inverter 240 converts the DC electrical power 213 into the AC driving signal 204.

As discussed in greater detail below, the rectifier assembly 120 is a modular assembly that is separate from and independent of the driving apparatus 210 and the inverter 240. The rectifier assembly 120 is configured for use with the driving apparatus 210 and/or any other driving apparatus that uses a converter or rectifier to convert the AC electrical power 205 into the DC power 213. The other driving apparatuses may have the same configuration as the driving apparatus 210, or the other driving apparatuses may be different types or different models of driving apparatus. The rectifier assembly 120 may be used to, for example, retrofit, upgrade, and/or repair an existing driving apparatus. For example, the rectifier assembly 120 may be used to upgrade the original rectifier in an existing driving apparatus by simply replacing the original rectifier with the rectifier assembly 120 and without having to replace the entire driver apparatus 210. Moreover, the modular nature of the rectifier assembly 120 allows an existing driving apparatus to be modified to suit the requirements of a particular application. Thus, the rectifier assembly 120 allows efficient reuse of existing equipment, reduces costs, and improves performance.

The rectifier assembly 120 also allows the driving apparatus 210 to be used in a more flexible manner. For example, although the rectifier assembly 120 is electrically connected to the inverter 240, the end user or other operator of the driving apparatus 210 may place the rectifier assembly 120 any place that is convenient for the application. For example, an end user may choose to mount the rectifier assembly 120 in a cabinet with the inverter 240 and associated equipment. Additionally, the end user may choose where in the cabinet to mount the rectifier assembly 120. On the other hand, the modular nature of the rectifier assembly 120 allows the end user or other operator to place the rectifier assembly 120 away from the inverter 240 and other components of the driving apparatus 210, for example, in an area that is separate from the inverter 140 and other components of the driving apparatus 210. For example, the end user may choose to place the rectifier assembly 120 in a separate room as compared to the other components of the driving apparatus 210.

FIG. 3A is a schematic of a system 300. The system 300 includes a modular rectifier assembly 320. The modulator rectifier assembly 320 is an implementation of the modular rectifier assembly 120 of FIGS. 1 and 2.

The system 300 includes an 18-pulse phase-shifting autotransformer 380 that is electrically connected to the modular rectifier assembly 320. The distribution network 201 includes three electrical phases A, B, C. The phases A, B, C are time-varying or AC electrical signals (for example, voltage signals) that have substantially the same magnitude but are phase shifted 120° relative to each other. The phase-shifting autotransformer 380 receives the three-phase electrical power from the distribution network 201 and produces a nine-phase AC output at nodes 1, 2, 3, 4, 5, 6, 7, 8, 9. The voltage at each of the nodes 1 through 9 is substantially the same magnitude but has a phase that is shifted by 40° relative to each adjacent node. Adjacent in this context refers to the numbering scheme for the nodes 1 through 9. In the example of FIG. 3A, nodes 1 and 2 are adjacent nodes, for example. The phase-shifting auto transformer 380 includes transformer coils 381 (only one of which is labeled for simplicity) and a neutral point N. The nodes 1 through 9 of the 18-pulse phase-shifting autotransformer 380 are electrically connected to an electronic network 322 of the modular rectifier assembly 320. In the example of FIG. 3A, the electronic network 322 of the modular rectifier assembly 320 is implemented as an 18-pulse rectifier. The modular rectifier assembly 320 includes diode modules 323_1, 323_2, 323_3, each of which includes a respective electronic network 322_1, 322_2, 322_3 that includes six diodes arranged to form a 6-pulse rectifier. In other words, the electronic network 322 is a 18-pulse rectifier implemented with three six-pulse rectifiers. The diode modules 323_1, 323_2, 323_3 are electrically connected in parallel to each other across a DC bus 324.

FIG. 3B is a schematic that shows the electronic network 322_1 in greater detail. The electronic network 322_1 is a three-phase six-pulse bridge that includes six electronic switches. In the example of FIGS. 3A and 3B, the six electronic switches are diodes D1 through D6. Each diode D1 through D6 includes a cathode and an anode and is associated with a forward bias voltage. Each diode D1 through D6 allows current to flow in the forward direction (from the anode to the cathode) when voltage of the anode is greater than the voltage of the cathode by at least the bias voltage. When the voltage difference between the anode and the cathode is less than the forward bias voltage, the diode does not conduct current in the forward direction. The anode of the diode D1 is connected to the cathode of the diode D4 to form a first pair of diodes. Node 1 of the phase-shifting autotransformer 380 is connected to the first pair of diodes between the anode of the diode D1 and the cathode of the diode D4. The anode of the diode D3 is connected to the cathode of the diode D6 to form a second pair of diodes. Node 2 of the phase shifting autotransformer 380 is connected to the second pair of diodes between the anode of the diode D3 and the cathode of the diode D6. The anode of the diode D5 is connected to the cathode of the diode D3 to form a third pair of diodes. Node 3 of the phase-shifting autotransformer 380 is connected to the third pair of diodes between the anode of the diode D5 and the cathode of the diode D2. The diodes D1 through D6 rectify the input currents from the nodes 1, 2, 3, respectively, into a rectified current that is provided to the DC bus 324.

Each of the electronic networks 322_2 and 322_3 also includes six diodes D1 through D6 arranged in the same manner (three pairs of diodes that form a six-pulse rectifier). Each of the nodes 4, 5, 6 of the phase-shifting autotransformer 380 is electrically connected to one pair of diodes in the electronic network 322_2. Each of the nodes 7, 8, 9 of the phase-shifting autotransformer 380 is electrically connected to one pair of diodes in the electronic network 322_3. The electronic networks 322_1, 322_2, 322_3 provide a rectified current id to the DC bus 324. Each electronic network 322_1, 322_2, 322_3 contributes equally to the DC current id.

A capacitor network 326 is connected across the DC bus 324. The rectified current id flows into the capacitor network 326 and is stored. The capacitor network 326 includes one or more capacitors that store and discharge electrical energy.

The inverter 340 converts the DC power stored in the capacitor network 326 into the AC driver signal 304 that is provided to the load 202. In this example, the AC driver signal 304 is a three-phase AC driver signal with phase components 304u, 304v, 304w, each of which is provided to one of the three-phases of the load 202. The inverter 340 includes a network of electronic switches SW1 through SW6 that are arranged to generate the driver signal 304. Each of the switches SW1 through SW6 may be, for example, a power transistor. The inverter 340 may implement, for example, a pulse width modulation (PWM) technique to modulate the energy that is stored in the capacitor network 326 into the AC driver signal 304. The PWM technique may be implemented based on any type of control algorithm, such as, for example, a 6-step electronic commutation, various field oriented controls, a space vector PWM, or a sinusoidal PWM. The switching of the electronic switches SW1 through SW6 is controlled such that the amplitude, frequency, and phase of the driver signal 304 is also controlled. The amplitude, frequency, and phase of the driver signal 304 determines the operating properties (for example the torque, speed, and/or direction) of the load 302.

The topology shown in FIGS. 3A and 3B is provided as an example, and other topologies may be used. For example, the 18-pulse phase-shifting autotransformer 380 may be implemented in any manner known in the art, such as, for example, a symmetric 18-pulse differential delta configuration or an asymmetric 18-pulse differential delta configuration. Moreover, other types of phase shifting auto-transformers and rectification configurations may be used. For example, the phase-shifting autotransformer 380 may be implemented as a 12-pulse phase shifting auto-transformer that produces six phase outputs based on a three-phase input, and the rectifier assembly 320 may be implemented as a 12-pulse rectifier that includes 6 pairs of diodes. In yet another example, the system 300 may be implemented without the phase-shifting autotransformer. In these implementations, the rectifier assembly 320 is implemented as a three-pulse rectifier that includes three pairs of diodes arranged as shown in FIG. 3B. In this implementation, each pair of diodes is electrically connected to one phase of the distribution network 201.

Referring to FIGS. 4A-4C, various aspects of another example of a modular rectifier assembly 420 are shown. The modular rectifier assembly 420 is an implementation of the modular rectifier assembly 120 and 320. FIG. 4A is an exterior side view of the rectifier assembly 420 in the X-Z plane, with hidden elements shown with dashed lines. FIG. 4B is a schematic of a diode module 428a. FIG. 4C is a top view of the rectifier assembly 420 in the X-Y plane.

The rectifier assembly 420 includes a mounting base 430 and a rectification module 423 that is mounted to the mounting base 430. The rectification module 423 includes three diode modules 428a, 428b, 428c, each of which includes a pair of diodes. FIG. 4B is a schematic that illustrates the electrical connections of the diode module 428a. The diode module 428a includes diodes 429_1 and 429_2. The diodes 429_1, 429_2 are connected in series with the cathode of the diode 429_2 electrically connected to the anode of the diode 429_1. The cathode of the diode 429_1 is connected to a conductor 427a. The anode of the diode 429_2 is connected to a conductor 427b. The conductor 427a is electrically connected to a conductor 425a, and the conductor 427b is electrically connected to a conductor 425b. The conductors 425a and 425b form a local DC bus 425. The conductors 427a, 427b, 425a, and 425b are made of an electrically conducting material, such as, for example, a metal or a metal alloy.

In the example of FIGS. 4A and 4C, the conductors 427a and 427b are rods or bars that extend in the Z direction, and the conductors 425a and 425b are rods or bars that extend in the X direction. The conductors 427a, 427b and the conductors 425a, 425b may be made of a single piece of metal or may be multiple pieces or metal that are permanently joined by, for example, welding or soldering. Other configurations are possible. For example, the diode conductors 427a, 427b may be wires rather than rigid bars or rods. Each of the diode modules 428b and 428c include two diodes arranged and connected to the conductors 425a, 425b in the same manner as shown in FIG. 4B.

The diodes 429_1 and 429_2 are in the diode module 428a. The diode module 428a is made out of any durable material, such as, for example, a rugged polymer or a metal material. Referring to FIGS. 4A and 4C, the conductors 427a and 427b pass through the diode module 428a generally in the Z direction. The conductor 427a is electrically connected to the conductor 425a. The conductor 427b is electrically connected to the conductor 425b. In this way, the conductors 427a and 427b electrically connect the diode module 428a across the local DC bus 425. The conductor 427a is electrically connected to the conductor 425a, for example, by soldering or welding, and the second diode conductor 427b is electrically connected to the conductor 425b, for example, by soldering or welding.

The rectification module 423 also includes the diode modules 428b and 428c, which are configured in the same manner as the diode module 428a. The diode modules 428b and 428c are connected across the local DC bus 425 in parallel with each other and the diode module 428a.

The rectification module 423 includes a heat sink 435 on which the diode modules 428a, 428b, 428c are mounted. The diode modules 428a, 428b, 428c are thermally coupled to the heat sink 435. For example, the diode modules 428a, 428b, 428c are thermally coupled to the h eat sink 435 by being in physical contact with at least part of the heat sink 435. A heat sink is a passive heat exchanger that removes heat from a heat source that is thermally coupled to the heat sink. The heat sink 435 is used to remove heat from the diode modules 428a, 428b, 428c. For example, the heat sink 435 may include a plate or block with openings or fasteners that hold the diode modules 428a, 428b, 428c. The diode modules 428a, 428b, 428c may be, for example, attached to the heat sink 435 with an adhesive and/or with mechanical fasteners such as screws and/or other mechanical hardware devices. The heat sink 435 is made of a material with a relatively high thermal conductivity, allowing the heat sink 435 to conduct or draw heat from the modules 428a, 428b, 428c. For example, the heat sink 435 may be made of a thermally conductive metal such as, for example, copper, aluminum, or an aluminum alloy.

The mounting base 430 is made of sheet metal or another durable material. The mounting base 430 includes three openings 432a, 432b, 432c. Each opening 432a, 432b, 432c is sized to receive one rectification module such as the rectification module 423. In the example of FIGS. 4A and 4C, the heat sink 435 is received in the opening 432a and is held to the mounting base 430 in the opening 432a to attach the rectification module 423 to the mounting base 430. For example, the heat sink 435 may be inserted into the opening 432a and held by an interference fit between the mounting base 430 and the heat sink 435. In another example, the heat sink 435 is attached to the mounting base 430 with an adhesive and/or with a mechanical fastener.

Additional rectification modules may be installed in the rectifier assembly 420. For example, one rectification module identical to the rectification module 423 may be installed into each of the openings 432b and 432c. In such an implementation, the rectifier assembly 420 forms an 18-pulse rectification module.

The rectification module 423 may include additional features. For example, in addition to the heat sink 435, the rectification module 423 may include one or more additional heat exchange elements that remove heat from the diode modules 428a, 428b, 428c. The additional heat exchange elements may be, for example, passive cooling elements such as additional heat sinks or openings that allow airflow, or active cooling elements such as fans, water-cooled heat exchangers, air-cooled heat exchangers, and/or thermoelectric cooling devices (such as peltier coolers).

Referring also to FIG. 4D, in operational use of the rectifier assembly 420, the conductors 425a and 425b are electrically connected to a DC bus 426 of an electrical network 411. The electrical network 411 may be, for example, the capacitor network 326 and the inverter 340 of FIG. 3A. For example, a first busbar 421a may be electrically connected to the conductor 425a of each rectification module 423 attached to the mounting base 430, and a second busbar 421b may be electrically connected to the conductor 425b of each rectification module 423 attached to the mounting base 430. In this example, the first busbar 421a and the second busbar 421b are attached to the end of the respective conductors 425a and 425b and extend along the X direction in FIGS. 4A and C.

One phase of a AC power source (not shown in FIGS. 4A-4C) is electrically connected to the diode module 428a between the first diode 429_1 and the second diode 429_2 at the node 431 (FIG. 4B). The diode module 428a rectifies the AC current from the AC power source and provides a rectified current to the local DC bus 425. Each diode module 428b, 428c is also electrically connected to one phase of a multi-phase power source. Additional instances of rectification modules may be added to the mounting base 430, and those rectification modules are also electrically connected to the multi-phase power source and the DC bus 426 in the same manner.

Figure 5:
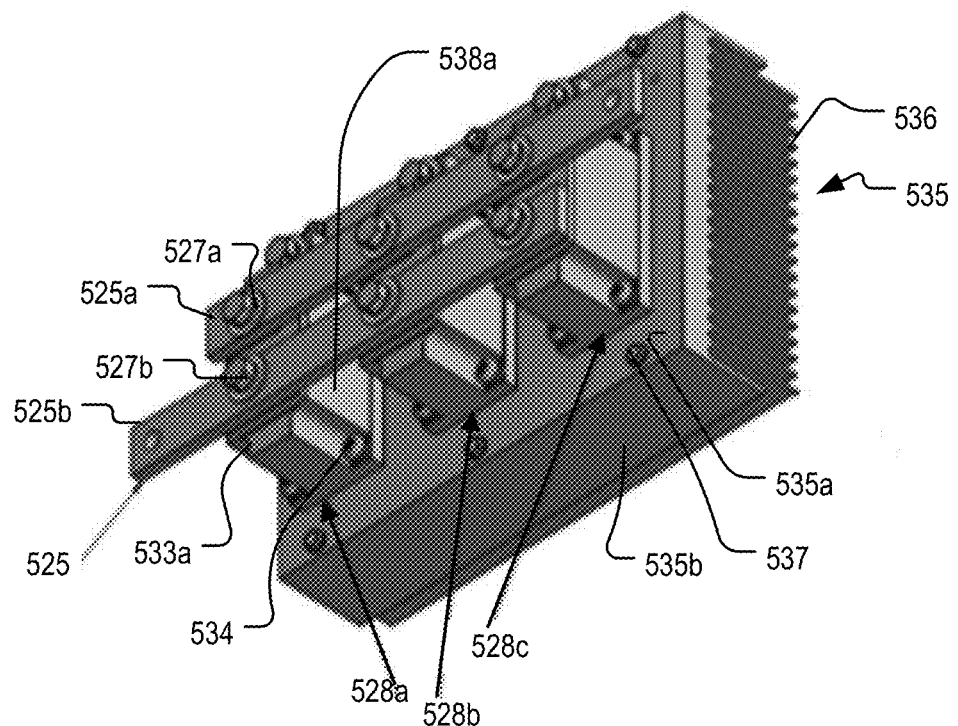
FIG. 5 is a perspective view of another example of a rectification module.
Figure 9B:
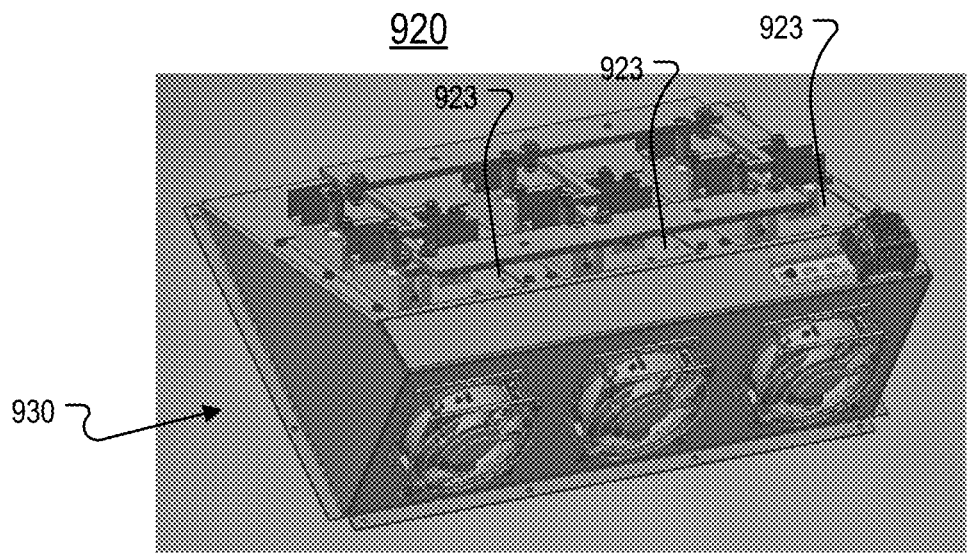
FIG. 9B is a perspective top view of an example of a rectifier assembly that includes the rectification module of FIG. 9A.
Figure 9A:
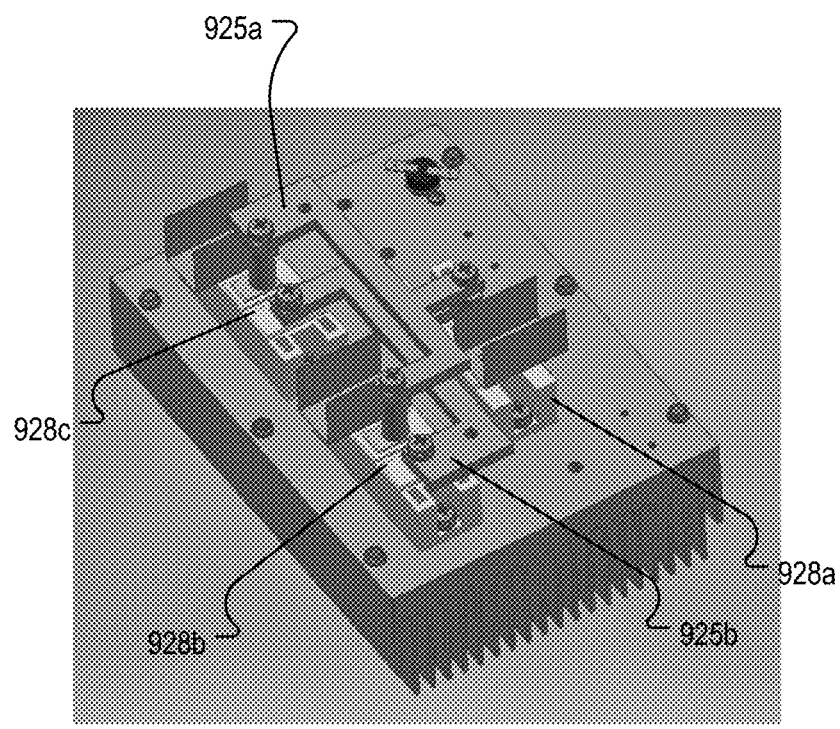
FIG. 9A is a perspective top view of another example of a rectification module.

Referring to FIG. 5, a perspective view of a rectification module 523 is shown. The rectification module 523 is configured for use with a modular rectifier assembly, such as the modular rectifier assembly 120 (FIG. 1), 420 (FIGS. 4A and 4C), 620 (FIG. 6A-6D), or 920 (FIGS. 9A and 9B).

The rectification module 523 includes diode modules 528a, 528b, 528c. Each of the diode modules 528a, 528b, 528c includes a pair of diodes that are connected in the configuration shown in FIG. 4B and a housing that encloses the diodes. The diode modules 528a, 528b, 528c are mechanically mounted to a heat sink 535 and are thermally coupled to the heat sink 535. For simplicity, only the housing of the diode module 528a is labeled in FIG. 5. The diode module 528a includes a housing 533a that encloses a pair of diodes. The housing 533a is made of a rugged material, such as, for example, sheet metal or steel. The housing 533a is attached to a top portion 535a of the heat sink 535 with screws 534. For simplicity, only one of the screws 534 is labeled. Although the screws 534 are depicted in FIG. 5, the housing 533a may be attached to the top portion 535a in another manner. For example, the housing 533a may be glued to the top portion 535a with a thermally conductive adhesive or a thermally conductive tape in addition to or instead of being screwed to the top portion 535a.

The heat sink 535 includes the top portion 535a, which is generally planar. The heat sink 535 also includes a side portion 535b that is connected to the top portion 535a. The side portion 535b is generally planar and extends away from the top portion 535a along a direction that is perpendicular to a plane that includes the top portion 535a. The heat sink 535 also includes another side portion (not shown) that is parallel to the side portion 535b, is connected to the top portion 535a, and extends away from the top portion 535a. The heat sink 535 also includes a plurality of fins 536 that extend away from the underside (not shown) of the top portion 535a. The underside of the top portion 535a is opposite to the top portion 535a. For simplicity, only one of the fins 536 is labeled in FIG. 5. Each fin 536 is a plate-like structure that is separated from the other fins. The heat sink 535 is made of a material with a relatively high thermal conductivity, such as, for example, aluminum or copper.

The housing 533a is made of any durable material, such as, for example, sheet metal or steel. As noted above, the heat sink 535 is in thermal contact with the diode modules 528a, 528b, 528c. The heat sink 535 transfers heat generated by the operation of the diodes in the diode modules 528a, 528b, 528c to a fluid medium. In the example of FIG. 5, the fluid medium is air that surrounds the rectification module 523. However, other implementations are possible. For example, the heat sink 535 may be used in combination with an active cooling element, such as, for example, a water channel that carries heat away from the heat skink 535 or a fan that encourages air flow through and/or in the vicinity of the heat sink 535 to thereby encourage heat removal.

The diode pair in each module 528a, 528b, 528c is electrically connected across a DC bus 525 formed by a first conductor 525a and a second conductor 525b. The first conductor 525a and the second conductor 525b are metal bars. The diode pair in the module 528a is electrically connected to the DC bus 525 with diode conductors 527a and 527b (which are electrically connected to the diodes in the module 528a). In the example shown, the diode conductors 527a and 527b are metallic screws that are secured to and electrically connected to the first and second conductors 525a and 525b, respectively, using nuts. The diode pair in the module 528b and the module 528c are also connected to the DC bus 525 in the same manner.

In the example of FIG. 5, a U-shaped connection bracket 538a is between the housing 533a and the conductors 525a and 525b. The diode conductors 527a and 527b extend through the housing 533a and the connection bracket 538a to be secured to the conductors 525a and 525b, respectively. In some implementations, the connection bracket 538a is not used.

Figure 6A:
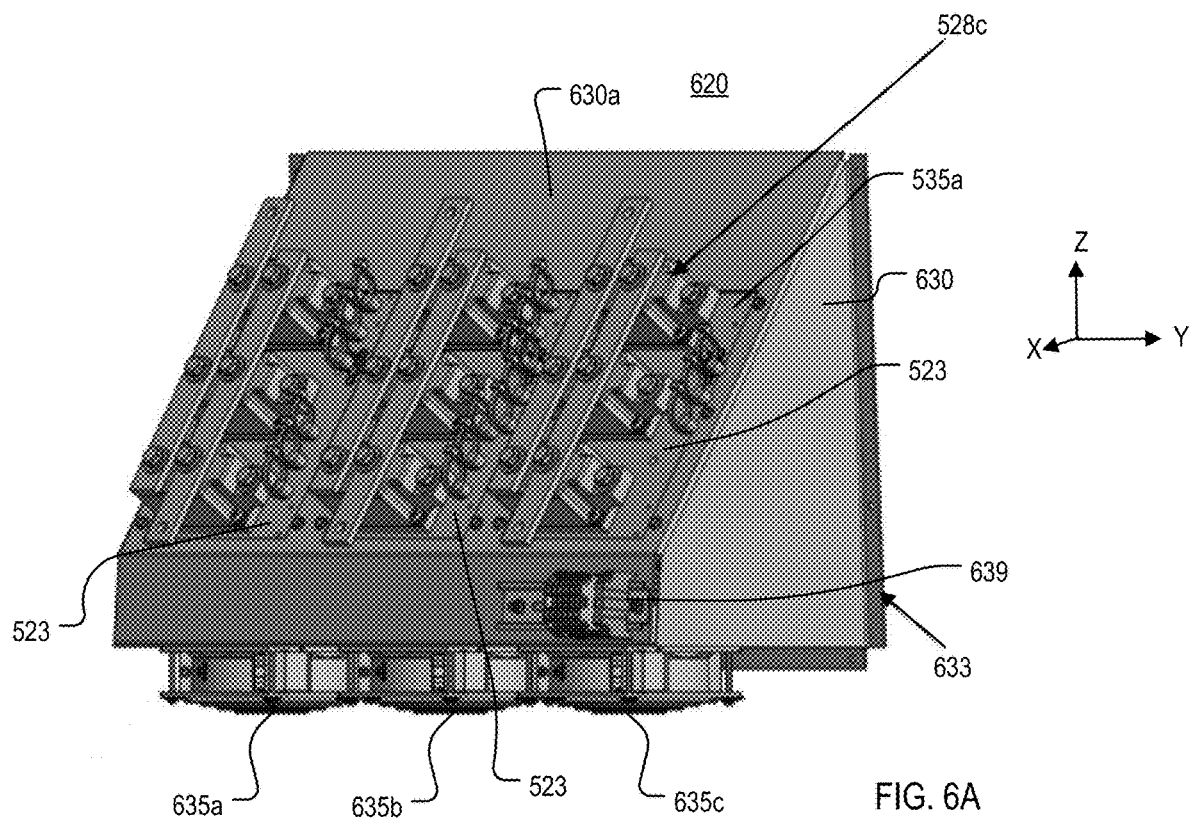
FIG. 6A is a perspective view of another example of a rectifier assembly.
Figure 6B:
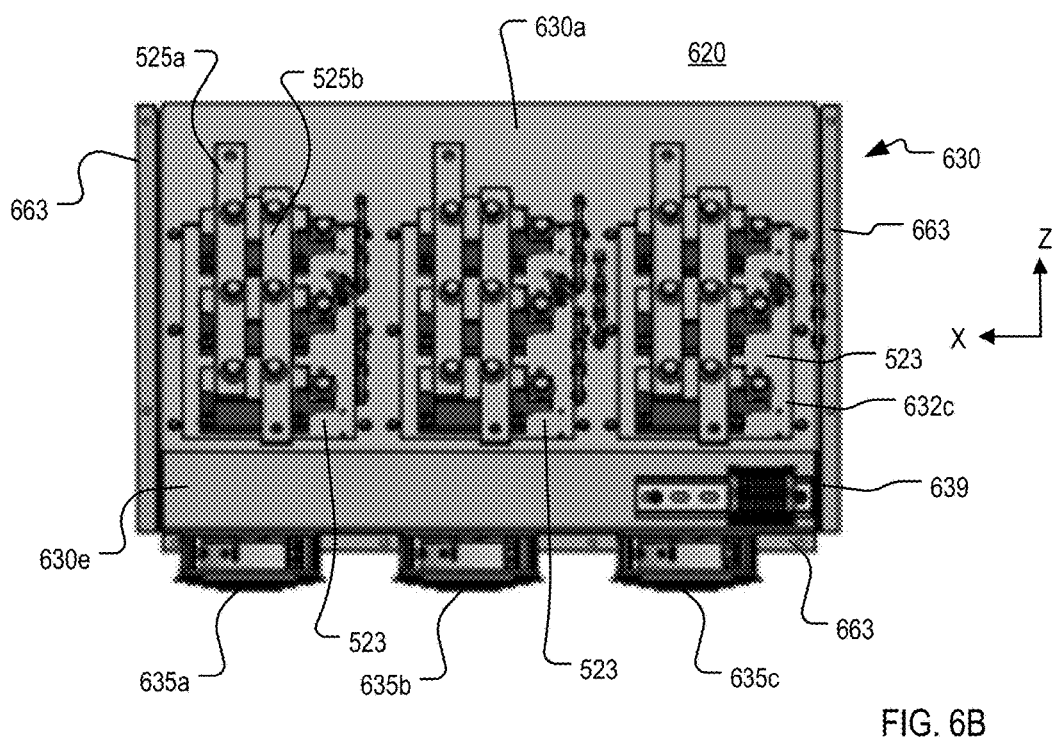
FIG. 6B is a top view of the rectifier assembly of FIG. 6A.
Figure 6C:
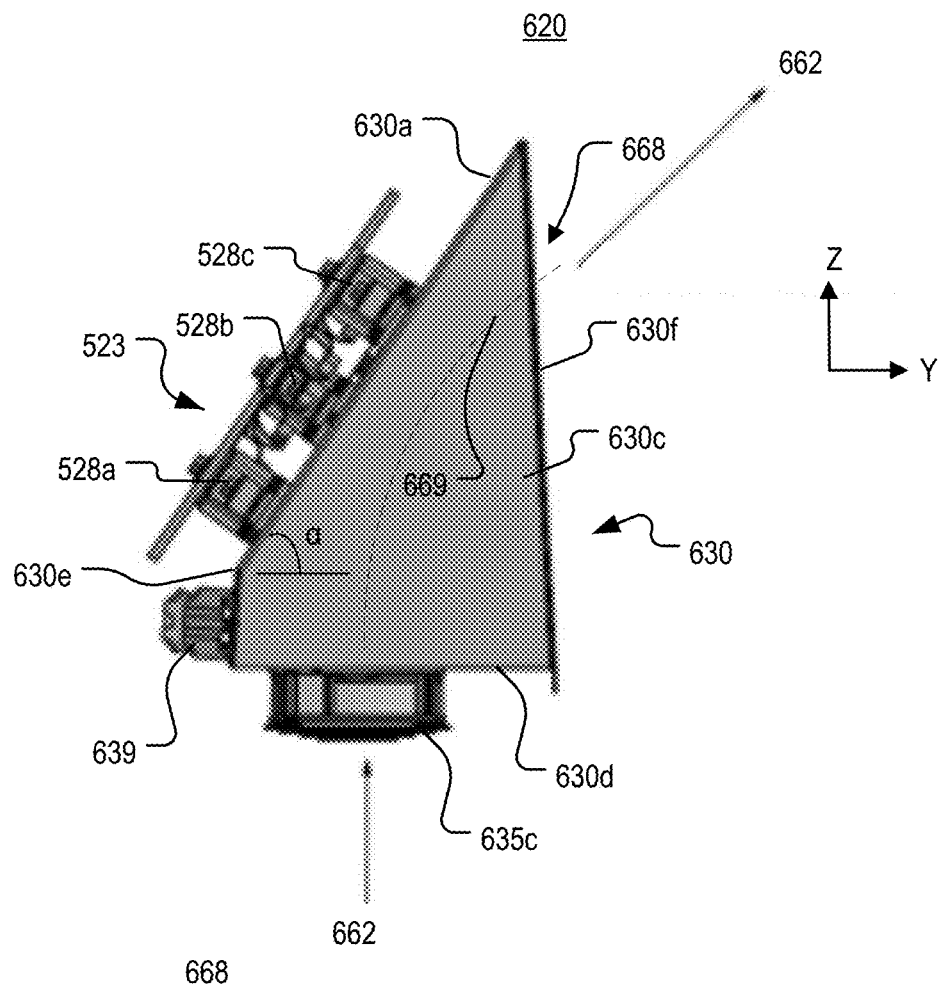
FIG. 6C is a side view of the rectifier assembly of 6A.
Figure 6D:
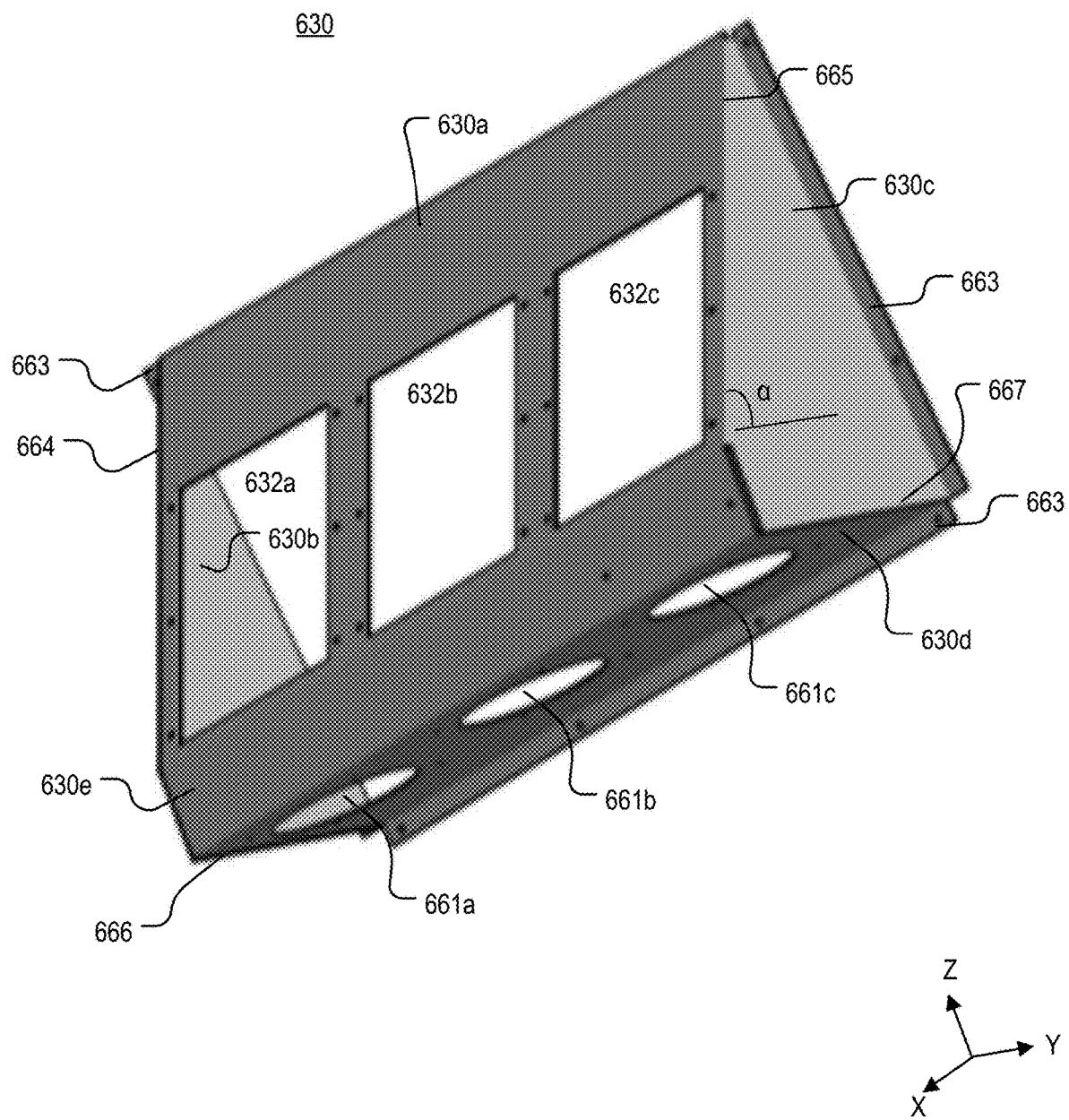
FIG. 6D is a perspective view of an example of a mounting base.
Figure 6E:
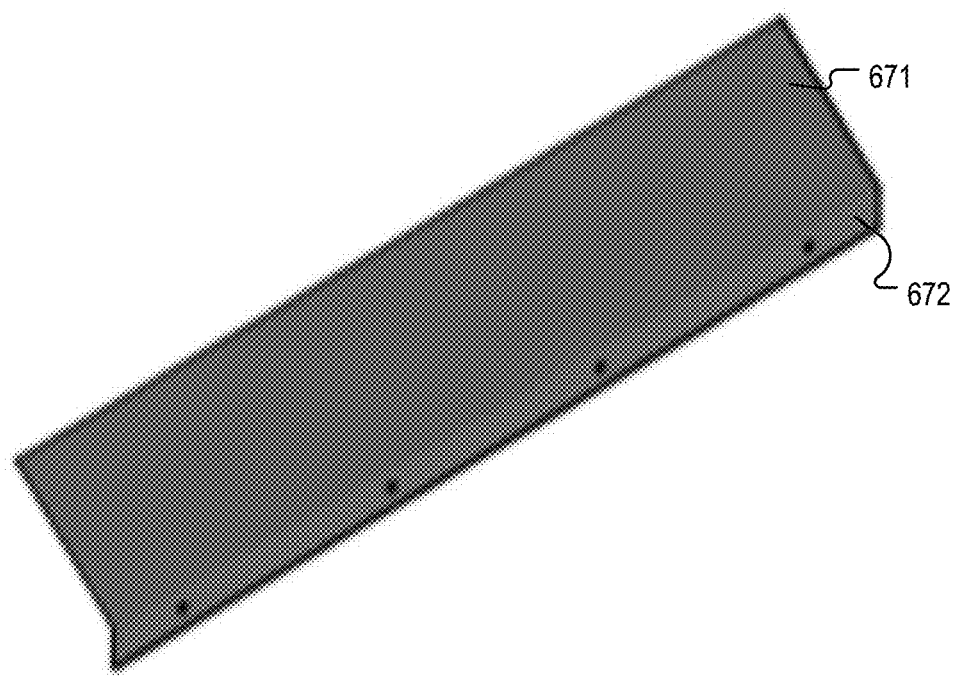
FIG. 6E is a perspective view of an example of an air baffle.

FIGS. 6A-6E show various aspects of another example rectifier assembly 620. The rectifier assembly 620 includes three instances of the rectification module 523 (FIG. 5). The rectifier assembly 620 is an 18-pulse rectifier. FIG. 6A is a perspective view of the rectifier assembly 620. FIG. 6B is a top view of the rectifier assembly 620. FIG. 6C is a side view of the rectifier assembly 620. FIG. 6D is a perspective view of a mounting base 630. FIG. 6E is a perspective view of an air baffle 670.

Referring to FIGS. 6A and 6B, the rectifier assembly 620 includes the mounting base 630, which holds three instances of the rectification module 523. Referring also to FIG. 6D, the mounting base 630 includes a plurality of sidewalls 630a through 630e. In the example shown, each of the sidewalls 630a through 630e is a substantially planar or plate-like structure. The sidewalls 630a through 630e are made of any durable material that is suitable for the application. For example, the sidewalls 630a through 630e may be made of sheet metal or steel.

The first sidewall 630a is a substantially planar structure that defines three openings 632a, 632b, 632c. Each opening 632a, 632b, 632c is the same size and shape. In the example shown, the openings 632a, 632b, 632b are rectangular; however, the openings 632a, 632b, 632b may be other shapes. As shown in FIGS. 6A and 6B, one instance of the rectification module 523 is held in each opening 632a, 632b, 632c. The mounting base 630 also includes the second sidewall 630b and the third sidewall 630c. The second sidewall 630b and the third sidewall 630c are the same size and shape, extend in the Y-Z plane, and are parallel to each other. The second sidewall 630b includes an edge 664 and an edge 666. The third sidewall 630c includes an edge 665 and an edge 667. The edge 666 and the edge 667 extend along the Y direction. The edge 664 and the edge 665 extend along a direction that is at an angle α relative to the Y direction. The angle α may be, for example, less than 90 degrees (°), the angle α may be zero degrees, or the α may be between 10° and 70°.

The mounting base 630 also includes a fourth sidewall 630d that extends in the X-Y plane between the second sidewall 630b and the third sidewall 630c. The fourth sidewall 630d is attached to the second sidewall 630b at the edge 666 and to the third sidewall 630c at the edge 667. The fourth sidewall 630d defines three openings 661a through 661c. Each opening 661a, 661b, 661c is configured to hold a respective fan 635a, 635b, 635c (FIGS. 6A and 6B). The openings 661a, 661b, 661c pass through the fourth sidewall 630d such that the fans 635a, 635b, 635c are able to draw air 662 (FIG. 6C) from one side of the fourth sidewall 630d to the other. In the example shown in FIGS. 6A-6D, the openings 661a, 661b, 661c are circular. However, any shape that allows a fan to be received and held in the opening may be used.

The first sidewall 630a extends between the second sidewall 630b and the third sidewall 630c. Specifically, the first sidewall 630a is connected to the second sidewall 630b at the edge 664 and to the third sidewall 630c at the edge 665. As discussed above, the edges 664 and 665 extend at the angle α relative to the Y direction, and the first sidewall 630a is a planar structure. Thus, the first sidewall 630a is angled at the angle α relative to the Y direction. Furthermore, and referring to FIG. 6A, when the rectification modules 523 are mounted in the mounting base 630, the modules 523 (and their respective components, such as the heat sink 535) are also angled at the angle α relative to the Y direction.

The mounting base 630 also includes a fifth sidewall 630e that extends in the X-Z plane and is connected to the first sidewall 630a, the second sidewall 630b, the third sidewall 630c, and the fourth sidewall 630d. The fifth sidewall 630e separates the first sidewall 630a and the fourth sidewall 630d in the Z direction. This spacing provides space to accommodate the fans 635a, 635b, 635c (FIGS. 6A and 6B). Furthermore, flanges 663 extend from the second sidewall 630b, the third sidewall 630c, and the fourth sidewall 630d.

Figure 8:
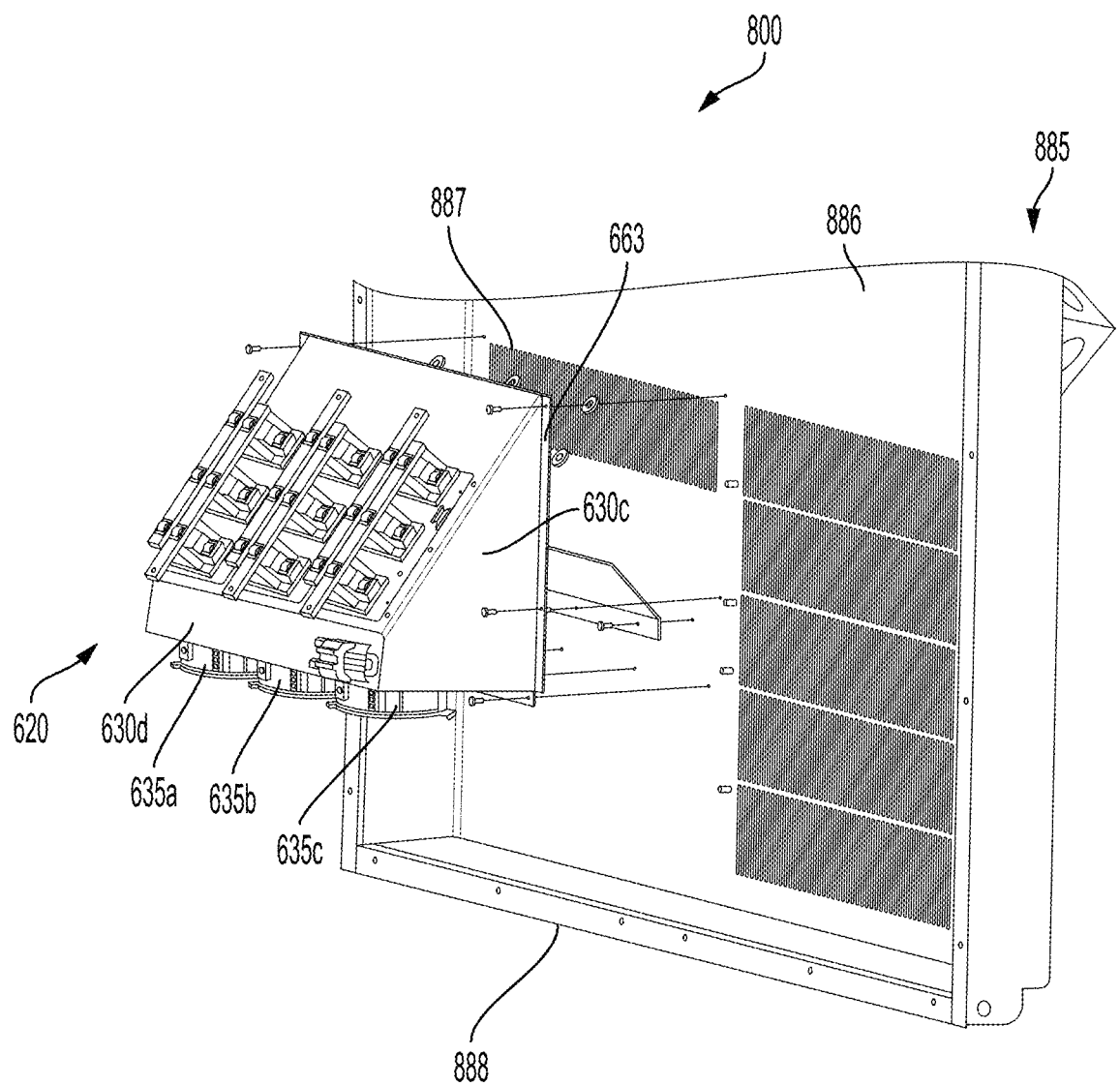
FIG. 8 shows an example of a system that includes a cabinet and the rectifier assembly of FIG. 6A.

The flanges 663 may be used to mount the mounting base 630 to a cabinet (such as shown in FIG. 8) or to another structure Referring also to FIG. 6C, the mounting base 630 also may include a sixth sidewall 630*f*. The sixth sidewall 630*f* extends in the X-Z plane and is connected to the first sidewall 630*a*, the second sidewall 630*b*, the third sidewall 630*c*, and the fourth sidewall 630*d*. In implementations that include the sixth sidewall 630*f*, the mounting base 630 is similar to an enclosure and may be referred to as the mounting enclosure 630. In implementations that include the sixth sidewall 630*f*, a vent or opening 668 (FIG. 6C) passes through the sixth sidewall 630*f* to allow air 662 to exit the enclosure 630. Some implementations do not include the sixth sidewall 630*f*. In these implementations, air exits from the mounting base 630 through an open region 668 between the second and third side walls 630*b* and 630*c*.

FIGS. 6A-6C show the rectifier assembly 620 in the assembled state. As shown in FIG. 6C, when the fans 635*a*, 635*b*, 635*c* are operational, they draw air 662 from a region 688 through the mounting base 630 along a path 669 and out an open region or vent 668 between the second and third sidewalls 630*b* and 630*c*. The heat sinks 535 (FIG. 5) are not shown in FIG. 6C, but, as discussed above, the heat sinks 535 are oriented at the angle α relative to the direction Y. The path 669 passes over, near, and/or through the spaces between the fins 536 (FIG. 5). Thus, the air 622 flows near or through the heat sinks 535 and aids in the removal of heat from the heat sinks 535. This allows for additional cooling and/or more effective cooling of the diode pairs in the diode modules 528*a*, 528*b*, 528*c* and increases the amount of time during which the diodes operate within their rated thermal limit and/or prevents occurrences of thermal conditions under which the diodes are unable to operate optimally.

Referring also to FIG. 6E, in some implementations, the mounting base 630 includes the baffle 670. Some implementations do not include the baffle 670. The baffle 670 is used to help direct the moving air 662 drawn into the base 630 by the fans 635*a*, 635*b*, 635*c* toward the heat sinks 535, thereby further enhancing the removal of heat from the heat sinks 535.

The baffle 670 includes a planar portion 671 and a flange 672 that extends from the planar portion 671. The flange 672 allows the baffle 670 to be attached to the mounting base 630. When attached to the mounting base 630, the planar portion 671 is in the path 669 (FIG. 6C). The flange 672 and the planar portion 671 are angled relative to each other such that the planar portion 671 directs the air 662 toward and through the heat sink 535. In other words, the baffle 670 directs the air 662 in such a way that more heat is removed from the heat sink 535. This allows the diodes in the diode modules 528*a*, 528*b*, 528*c* to operate more efficiently and/or for a longer period of time.

Figure 7A:
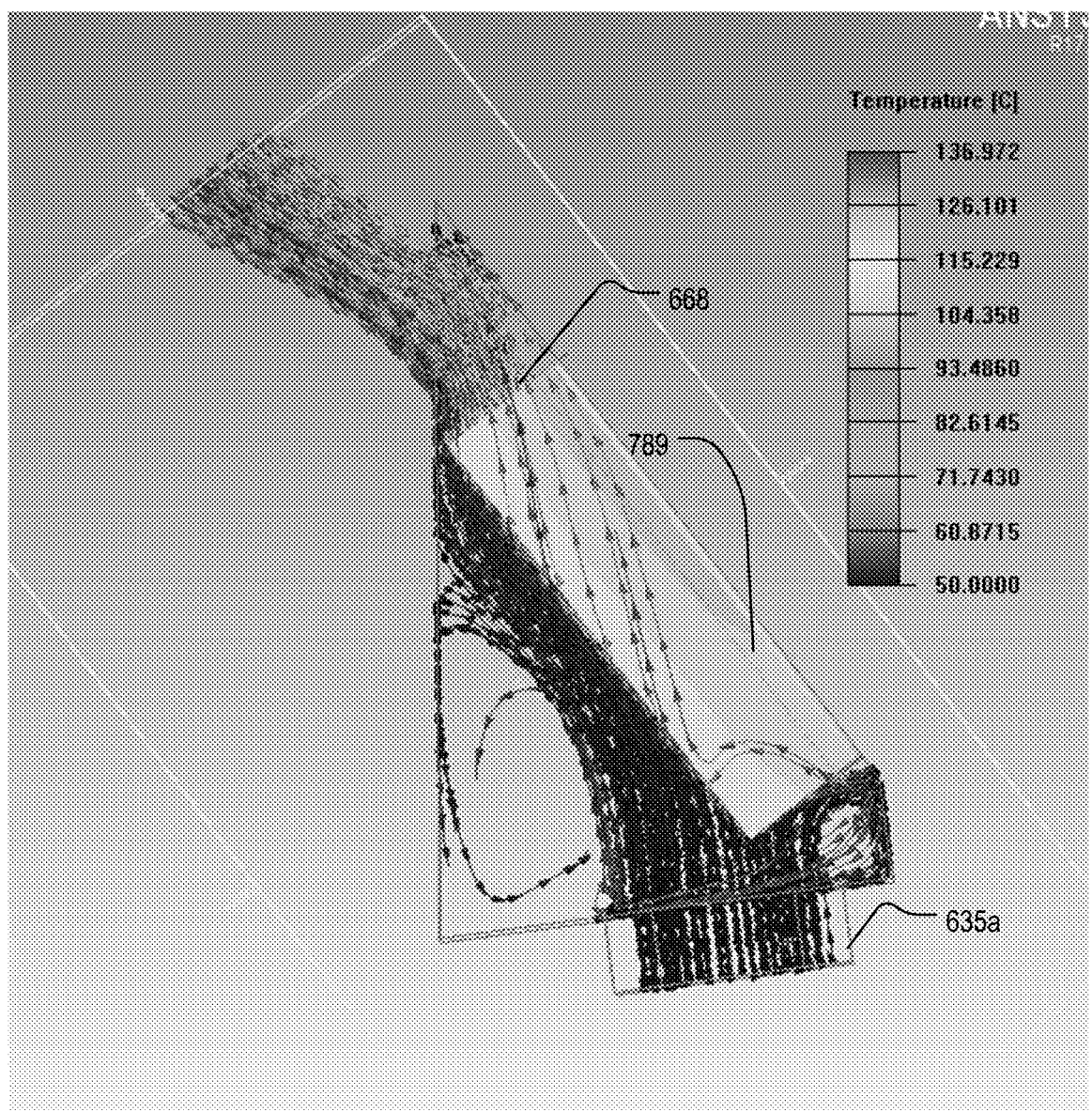
FIGS. 7A and 7B show examples of thermal data.
Figure 7B:
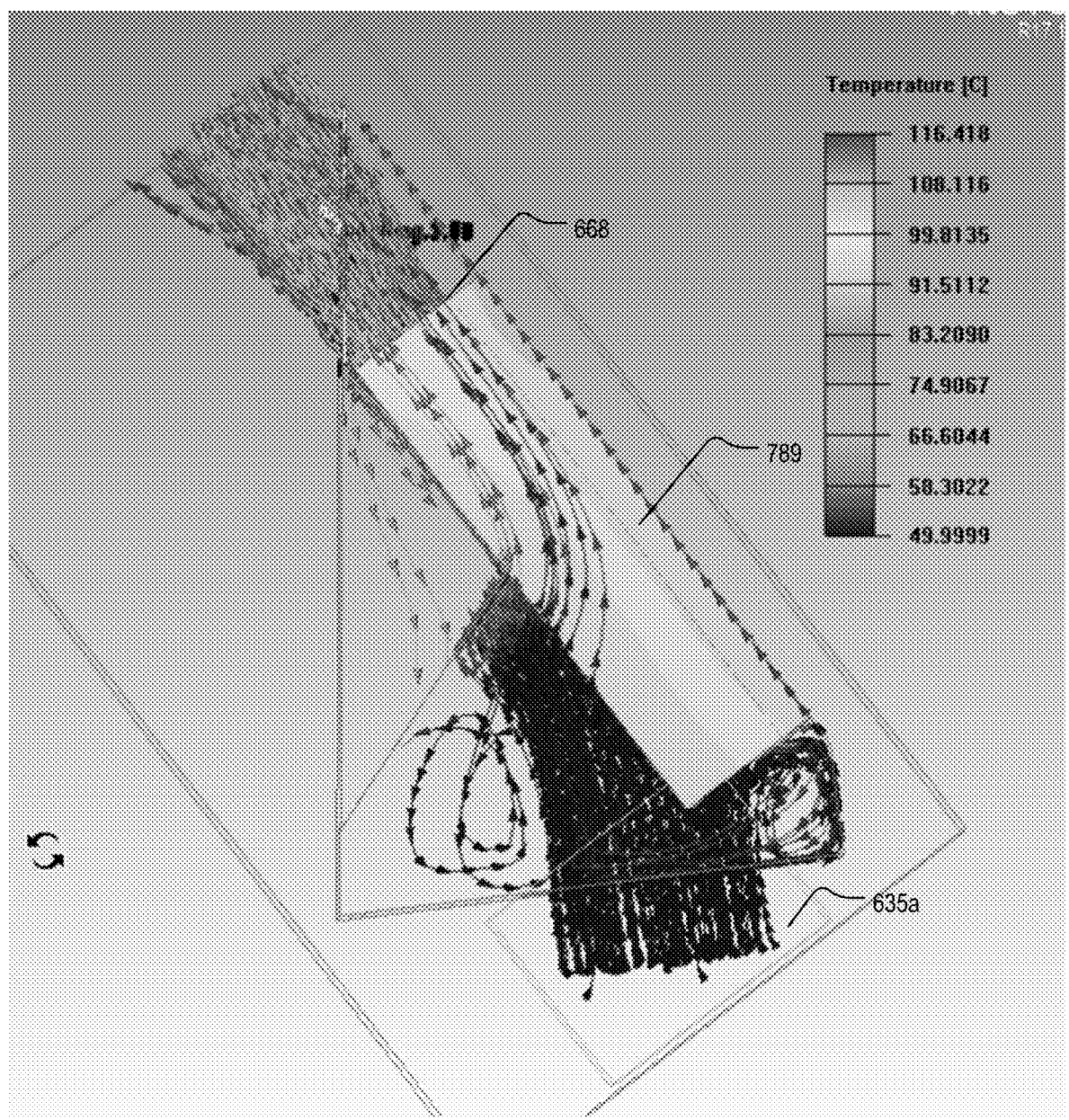

FIG. 7A shows simulated thermal data for the rectifier assembly 620 without the baffle 670. FIG. 7B shows thermal data for the rectifier assembly 620 with the baffle 670. The data shown in FIGS. 7A and 7B represents simulated temperature in two dimensions for a side cross section of the rectifier assembly 620. In the examples of FIGS. 7A and 7B, the solid lines with arrows represent the direction of air flow through the rectifier assembly 620. The air is drawn into the rectifier assembly 620 by the fan 635*a* at the bottom of the assembly 620, and the air exits through the open region 668. In the simulations, the inlet at 635*a* was 60 square inches, and the cooling temperature at the inlet was less than 50° C. As shown by comparing FIGS. 7A and 7B, the air flow is more directed and concentrated in the simulation in which the baffle 670 is used (FIG. 7B). Furthermore, the temperature is lower in the rectifier assembly 620 in the simulation in which the baffle 670 was used (FIG. 7A). For example, the region labeled 789 had a temperature of about 115° C. in the simulation without the baffle 760 (FIG. 7A) and a temperature of about 100° C. in the simulation with the baffle 760 (FIG. 7B).

Returning to FIGS. 6A-6C, the rectifier assembly 620 includes an input interface 639. The input interface 639 is on the sidewall 630*e* in the example shown in FIGS. 6A-6C. The input interface 639 includes a plurality of electrical connection points, each of which is electrically connected to one of the diode modules 528*a*, 528*b*, 528*c* of each instance of the rectification module 523. The electrical connection points also accept a connection to one phase of a multi-phase power source (such as the phase-shifting autotransformer 380 of FIG. 3A). In other words, the input interface 639 provides an interface for the source to electrically connect to the diode modules.

To connect the rectifier assembly 620 to an inverter to form a driver apparatus, the conductors 525*a* and 525*b* on each instance of the rectification module 523 are electrically connected to a DC bus that is also connected to the inverter. For example, the conductors 525*a* and 525*b* of each rectification module 523 may be electrically connected to respective first and second bus bars (not shown) that are electrically connected to the DC bus of a driving apparatus. The first bus bar may be a metal bar that is in contact with the conductor 525*a* of each rectification module 523. The second bus bar may be a metal bar that extends in the X direction and is in contact with the conductor 525*b* of each rectification module 523.

Referring to FIG. 8, a system 800 is shown. The system 800 includes a cabinet 885 and the rectifier assembly 620. A partial perspective view of the cabinet 885 is shown in FIG. 8. The cabinet 885 is a hollow enclosed space that has a door or other access point. The cabinet 885 is used to house equipment, such as, for example, an inverter such as the inverter 240, cables, monitoring systems, and computing equipment. In the example of FIG. 8, the cabinet 885 is used to enclose the rectifier assembly 620. The cabinet 885 may or may not include additional equipment.

The cabinet 885 includes an interior wall 886. The interior wall 886 is substantially flat and defines a plurality of vents 887. Each vent 887 includes a plurality of openings that pass through the interior wall 886. In other words, the vents 887 allow air or other fluids to enter and leave the cabinet 885.

The flanges 663 of the rectifier assembly 620 are attached to the wall 886 to mount the rectifier assembly 620 to the wall 886. The open region 668 (FIG. 6C) of the rectifier assembly 620 faces the wall 88 and is aligned with one of the vents 887 such that air is able to flow through the assembly 620. The fourth sidewall 630*d* faces away from the wall 886. The fans 635*a*, 635*b*, 635*c* face down toward a bottom 888 of the cabinet 885. In operational use, the fans 635*a*, 635*b*, 635*c* draw air from the bottom 888 through the rectifier assembly 620 and exhaust the air through the vent 887 that aligns with the open region 668 of the assembly 620.

Orienting the rectifier assembly 620 with the fans 635*a*, 635*b*, 635*c* positioned to draw air from the region near the bottom 888 (as shown in FIG. 8) may help to ensure that relatively cooler air is drawn into the rectifier assembly 620. For example, relatively cool air generally sinks and is more likely to be near the bottom 888. On the other hand, the orientation of the rectifier assembly 620 in the cabinet 885 depicted in FIG. 8 is an example, and other orientations are possible. For example, the rectifier assembly 620 may be rotated 90° or 180° relative to the configuration shown. Such other orientations may be desired if, for example, the bottom region 888 is unusually warm due to the presence of a particular piece of equipment or if the bottom region 888 is crowded with equipment such that little air is present in the bottom region 888. Moreover, the rectifier assembly 620 may be mounted on structures other than the wall 886. For example, the rectifier assembly 620 may be mounted on a cabinet door, or any substantially flat structure that is sufficiently strong to support the rectifier assembly 620.

Other implementations are within the scope of the claims. For example, the diode modules of the rectification modules used in a rectifier assembly may be arranged in any manner that is suitable for the application. Referring to FIG. 9A, another implementation of a rectification module 923 that is used in a rectifier assembly 920 (FIG. 9B) is shown. The rectification module 923 includes diode modules 928*a*, 928*b*, 928*c*, each of which includes a pair of diodes electrically connected as shown in FIG. 4B. The rectification module 923 also includes a local DC bus formed from conductors 525*a* and 525*b*. The diode modules 928*a*, 928*b*, 928*c* are electrically connected to the local DC bus 525. Three instances of the rectification module 523 are mounted to a mounting base 930 to form the rectifier assembly 930.

Moreover, other implementations and uses are possible. For example, the any of the rectifier assemblies 120, 220, 420, 520, 620, and 920 may be used to drive more than one electrical network such as the network 411 (FIG. 4D). For example, the any of the rectifier assemblies 120, 220, 420, 520, 620, and 920 may be used to drive a plurality of instances of networks (each including a capacitor network and an inverter) that receive DC electrical power from a bus electrically connected to the output of the rectifier assembly. In these implementations, the output of the rectifier assembly 120, 220, 420, 520, 620, or 920 is electrically connected to a DC bus that powers more than one inverter such that the rectifier assembly 120, 220, 420, 520, 620, or 920 becomes part of a driving apparatus that drives more than one AC motor or other AC load.

What is claimed is:

1. A rectifier assembly for use with an alternating current (AC) drive, the rectifier comprising:
    a mounting base;
    a plurality of rectification modules configured to be received in the mounting base, each rectification module comprising: an electronic network comprising a plurality of electronic elements configured to convert alternating current (AC) electrical power at an input of the electronic network to direct current (DC) electrical power at an output of the electronic network;
    a plurality of active heat exchange elements configured to be received in the mounting base, each of the active heat exchange elements associated with one of the rectification modules; and
    a DC bus comprising a first conductor, and a second conductor, wherein the rectification modules are electrically connected across the DC bus.

2. The rectifier assembly of claim 1, wherein each of the active heat exchange elements comprises a fan, and each rectification module further comprises a heat sink thermally coupled to the electronic network, and the rectifier assembly further comprises a baffle configured to direct air drawn by the fans toward the heat sinks.

3. The rectifier assembly of claim 1, wherein the mounting base comprises a plurality of openings, each opening configured to receive one of the plurality of rectification modules.

4. The rectifier assembly of claim 3, wherein the mounting base further comprises a second sidewall that extends from the first sidewall, the second side wall comprises a plurality of heat exchange openings, and each heat exchange opening is configured to receive one of the active heat exchange elements.

5. The rectifier assembly of claim 4, wherein the heat exchange openings are positioned such that the active heat exchange elements dissipate heat generated by the rectification modules.

6. The rectifier assembly of claim 1, further comprising a passive heat exchange assembly, and wherein the active heat exchange elements are configured to increase an amount of heat that the passive heat exchange assembly removes from the plurality of rectification modules.

7. The rectifier assembly of claim 6, wherein the passive heat exchange assembly comprises a heat sink thermally coupled to each rectification module.

8. The rectifier assembly of claim 1, wherein the mounting base comprises one or more mounting structures configured to mount the rectifier assembly to a wall.

9. The rectifier assembly of claim 8, wherein the mounting base comprises a mounting portion and a mounting opening, the mounting portion and mounting opening being configured to face the wall, such that, when the rectifier assembly is mounted to the wall, the rectifier is positionable relative to a vent in the wall to allow air flow driven by the active heat exchange elements to exit the mounting base through the mounting opening and the vent in the wall.

10. The rectifier assembly of claim 1, the plurality of rectification modules comprises three rectification modules, each of the three rectification modules comprises six diodes, and the total eighteen diodes connected to the DC bus form an 18-pulse rectifier.

11. A rectification module comprising:
    a heat sink comprising:
        a substantially planar portion comprising a first side and a second side opposite the first side; and
        a plurality of fins that extend from the first side of the substantially planar portion;
    one or more housings attached to the second side of the substantially planar portion and thermally coupled to the substantially planar portion;
    an electronic network inside each of the one or more housings, wherein each of the electronic networks configured as a rectifier that converts AC power at an input of the rectifier to DC power at the output of the rectifier; and
    a DC bus comprising a first conductor, and a second conductor, wherein each of the first conductor and the second conductor are physically connected to the one or more housings and are electrically connected to output of the one or more rectifiers.

12. The rectification module of claim 11, wherein each electronic network comprises a pair of diodes.

13. The rectification module of claim 11, wherein the heat sink comprises two side portions that each extend from the substantially planar portion, and the plurality of fins are between the two side portions.

14. The rectification module of claim 11, wherein the heat sink is configured to be inserted into an opening in a mounting base.

15. The rectification module of claim 14, wherein the heat sink is configured to be removed from the opening in the mounting based after being inserted into the mounting base.

16. The rectification module of claim 11, further comprising a connection bracket between each of the one or more housings and the first conductor and the second conductor, and the output of the rectifier in each of the one or more housings extends through the connection bracket.

17. The rectification module of claim 11, wherein the connection bracket is a U-shaped bracket.

18. The rectification module of claim 11, wherein the one or more housings are attached to the second side of the substantially planar portion with a thermally conductive material.

19. The rectification module of claim 11, wherein each fin is a planar piece that is separated from all of the other fins.

20. The rectification module of claim 11, further comprising an active thermal exchange assembly configured to dissipate heat from the heat sink.

* * * * *